(12) United States Patent
Umeda et al.

(10) Patent No.: US 11,985,899 B2
(45) Date of Patent: May 14, 2024

(54) PIEZOELECTRIC ELEMENT

(71) Applicant: FUJIFILM Corporation, Tokyo (JP)

(72) Inventors: Kenichi Umeda, Ashigarakami-gun (JP); Yukihiro Okuno, Ashigarakami-gun (JP); Takami Arakawa, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 76 days.

(21) Appl. No.: 17/539,422

(22) Filed: Dec. 1, 2021

(65) Prior Publication Data

US 2022/0093844 A1 Mar. 24, 2022

Related U.S. Application Data

(63) Continuation of application No. PCT/JP2020/019840, filed on May 20, 2020.

(30) Foreign Application Priority Data

Jun. 12, 2019 (JP) ................. 2019-109611

(51) Int. Cl.
*H10N 30/079* (2023.01)
*H10N 30/00* (2023.01)

(52) U.S. Cl.
CPC ..... *H10N 30/10516* (2023.02); *H10N 30/079* (2023.02)

(58) Field of Classification Search
None
See application file for complete search history.

(56) References Cited

U.S. PATENT DOCUMENTS

2006/0139414 A1 6/2006 Iwashita et al.
2008/0024563 A1* 1/2008 Matsui ................. H10N 30/076
310/365

(Continued)

FOREIGN PATENT DOCUMENTS

EP 3 118 347 A1 1/2017
JP 7-142600 A 6/1995

(Continued)

OTHER PUBLICATIONS

Cheng et al., "Characteristics of Optical Emission Spectra Induced by Laser Beams and Crystallization of PBZNZT Thin Films," Plasma Processes and Polymers, vol. 6, 2009, pp. 5817-5821.

(Continued)

*Primary Examiner* — Erica S Lin
(74) *Attorney, Agent, or Firm* — Birch, Stewart, Kolasch & Birch, LLP

(57) ABSTRACT

A piezoelectric element includes, in sequence, a substrate, a lower electrode layer, a growth control layer, a piezoelectric layer including a perovskite-type oxide containing lead as a main component of an A site, and an upper electrode layer. The growth control layer includes a metal oxide represented by $M_dN_{1-d}O_e$, where M is one or more metal elements capable of substituting for the A site of the perovskite-type oxide. When the electronegativity of M is X, $1.41X-1.05 \leq d \leq A1 \cdot \exp(-X/t1) + y0$, where $A1=1.68 \times 10^{12}$, $t1=0.0306$, and $y0=0.59958$. The perovskite-type oxide is represented by $(Pb_{a1}\alpha_{a2})(Zr_{b1}Ti_{b2}\beta_{b3})O_c$, where $0.5 < a1/(b1+b2+b3) < 1.07$.

1 Claim, 5 Drawing Sheets

(56) References Cited

U.S. PATENT DOCUMENTS

| | | | |
|---|---|---|---|
| 2010/0079552 A1 | 4/2010 | Arakawa et al. | |
| 2014/0014943 A1* | 1/2014 | Ting | H01L 29/247 |
| | | | 257/E29.101 |
| 2016/0027988 A1* | 1/2016 | Nagahata | B41J 2/17596 |
| | | | 310/365 |
| 2017/0133581 A1* | 5/2017 | Kobayashi | C23C 14/06 |
| 2019/0013459 A1 | 1/2019 | Kijima et al. | |

FOREIGN PATENT DOCUMENTS

| | | |
|---|---|---|
| JP | 2001-223403 A | 8/2001 |
| JP | 2006-186258 A | 7/2006 |
| JP | 2010-80813 A | 4/2010 |
| JP | 2010-84160 A | 4/2010 |
| JP | 2019-16793 A | 1/2019 |
| WO | WO 2014/007015 A1 | 1/2014 |
| WO | WO 2015/194458 A1 | 12/2015 |

OTHER PUBLICATIONS

Japanese Office Action for corresponding Japanese Application No. 2021-525960, dated Jul. 26, 2022, with English translation.
Wang et al., "Large piezoelectricity on Si from highly (001)-oriented PZT thick films via a CMOS-compatible sputtering/RTP process," Materialia, vol. 5, Jan. 24, 2019, 12 pages total.
International Preliminary Report on Patentability and English translation of the Written Opinion of the International Searching Authority for International Application No. PCT/JP2020/019840, dated Dec. 23, 2021.
International Search Report for International Application No. PCT/JP2020/019840, dated Jul. 14, 2020, with English translation.
Extended European Search Report dated May 19, 2023 for Application No. 20823477.3.
Tseng et al. "Growth Behavior of LaNiO3 and Their Effect on the Pulsed Laser Deposited PLZT Films", IEEE, 1996, pp. 341-344.

* cited by examiner

PIEZOELECTRIC ELEMENT

CROSS-REFERENCE TO RELATED APPLICATIONS

This application is a Continuation of PCT International Application No. PCT/JP2020/019840 filed on May 20, 2020, which claims priority under 35 U.S.C. § 119(a) to Japanese Patent Application No. 2019-109611 filed on Jun. 12, 2019. Each of the above application(s) is hereby expressly incorporated by reference, in its entirety, into the present application.

BACKGROUND OF THE INVENTION

1. Field of the Invention

The present disclosure relates to piezoelectric elements.

2. Description of the Related Art

Lead zirconate titanate ($Pb(Zr,Ti)O_3$, hereinafter referred to as PZT) thin films, which have superior piezoelectricity and ferroelectricity, are known. Because of their ferroelectricity, PZT films are used for ferroelectric random access memory (FeRAM), which is a type of non-volatile memory. Furthermore, nowadays, micro-electro-mechanical systems (MEMS) piezoelectric elements using PZT films are also being put into practical use through fusion with MEMS technology. PZT films have been used in various devices such as ink jet heads (actuators), micromirror devices, angular rate sensors, gyroscope sensors, and vibration energy harvesters.

To achieve superior piezoelectricity and ferroelectricity required for such various devices, PZT films need to be composed of a crystal of a good perovskite structure. However, a pyrochlore phase tends to form as an impurity phase during the deposition of a PZT film. Because a pyrochlore phase is a paraelectric material, it degrades the dielectric constant and piezoelectric properties of the PZT film. Accordingly, there is a need for a technique for inhibiting a pyrochlore phase and thereby obtaining a PZT thin film of a perovskite single phase.

It is thought that PZT is difficult to form with a stable composition since lead (Pb) is a highly volatile, very unstable element. To stably form PZT, the Pb component needs to be controlled. In general, PZT is often grown in a Pb-excess atmosphere by taking into account the volatility of Pb.

On the other hand, it is thought that the presence of excess Pb in a PZT film tends to decrease its drive reliability in a high-humidity environment; therefore, excess Pb needs to be minimized. JP2010-80813A (Patent Literature 1) discloses that a PZT system exhibits improved durability when the molar ratio of an A site element to a B site element, a/b, is from 0.85 to less than 1.0.

JP2010-84160A (Patent Literature 2) disclose techniques in which a PZT film is deposited with an increased amount of Pb only during the deposition of the initial layer and subsequently PZT is formed under conditions where the amount of Pb is smaller than that during the deposition of the initial layer.

In addition, JP1995-142600A (JP-H7-142600A, Patent Literature 3) and JP2001-223403A (Patent Literature 4) discuss the introduction of a growth control layer (also called "seed layer", "buffer layer", or "orientation control layer") to control the stability of Pb. For example, Patent Literature 3 discloses a method in which $BaTiO_3$ is formed as an orientation control layer on a platinum (Pt) thin film and $PbTiO_3$ is formed thereon by chemical vapor deposition (CVD). In addition, Patent Literature 4 discloses a method in which a PZT film with good crystallinity is formed by the use of a material having an oxygen octahedral structure as an orientation control layer.

SUMMARY OF THE INVENTION

In Patent Literature 1, there is no particular mention of a pyrochlore phase. According to this literature, a film is deposited by normal vapor deposition, with no particular measure being taken so that no pyrochlore phase forms. Thus, it is believed that the formation of a pyrochlore phase cannot be avoided under the conditions in Patent Literature 1, in which the amount of Pb is small.

According to the techniques disclosed in Patent Literature 2, a PZT film in which the molar ratio of an A site element to a B site element, a/b, is less than 1.07 as a whole can be obtained while a pyrochlore phase is inhibited. However, because the amount of Pb is increased during the deposition of the initial layer, a film containing a large amount of Pb in the interfacial region is formed. The physical properties of the interfacial region adjacent to the substrate are very important since functioning as a piezoelectric element involves the displacement of the substrate due to the expansion and contraction of the piezoelectric film. The techniques disclosed in Patent Literature 2 is unsatisfactory in terms of drive reliability in a high-humidity environment since a film containing a large amount of Pb in the interfacial region is formed. In addition, there is a possibility that a pyrochlore phase has formed in the initial layer.

Patent Literature 3 discloses that, by providing $BaTiO_3$ on a Pt thin film and forming a $PbTiO_3$ layer thereon, a PZT layer that has inherited the orientation of the Pt thin film can be formed. This literature also discloses that similar effects can be expected for compounds that are oxides, as is PZT, and that have lattice constants relatively close to those of PZT, and gives examples of compounds for orientation control layers, such as strontium titanate ($SrTiO_3$), barium oxide (BaO), strontium oxide (SrO), cerium oxide (CeO), and magnesium oxide (MgO). However, in Patent Literature 3, the electrode is limited to a Pt film, and there is no discussion of the use of other electrodes.

In Patent Literature 4, a single-phase PZT film is obtained by the use of a material having an oxygen octahedral structure such as a perovskite structure as an orientation control layer. However, in Patent Literature 4, the orientation control layer is limited to a particular crystal structure since a single-phase PZT film is grown by lattice matching with the crystal structure of the orientation control layer. In addition, there is no mention of the control of the amount of Pb.

In Patent Literature 3 and Patent Literature 4, there is also no discussion of the control of the amount of Pb or drive reliability in a high-humidity environment.

The present disclosure has been made in view of the foregoing circumstances. An object of the present disclosure is to provide a piezoelectric element that has high drive reliability in a high-humidity environment and that includes a piezoelectric layer formed of a perovskite-type oxide containing Pb.

The techniques of the present disclosure include the following aspects:
<1>
A piezoelectric element including, in sequence:
a substrate;
a lower electrode layer;
a growth control layer;
a piezoelectric layer including a perovskite-type oxide containing lead as a main component of an A site; and
an upper electrode layer,
wherein the growth control layer includes a metal oxide represented by the following general formula (1):

$$M_d N_{1-d} O_e \quad (1)$$

where
M is one or more metal elements capable of substituting for the A site of the perovskite-type oxide,
N includes, as a main component, at least one selected from the group consisting of Sc, Zr, V, Nb, Ta, Cr, Mo, W, Mn, Fe, Ru, Co, Ir, Ni, Cu, Zn, Sn, Ga, In, and Sb,
O is oxygen, and
d and e each represent a compositional ratio, where 0<d<1, and when the electronegativity of M is X, $$1.41X - 1.05 \leq d \leq A1 \cdot \exp(-X/t1) + y0$$

where $A1 = 1.68 \times 10^{12}$, $t1 = 0.0306$, and $y0 = 0.59958$, and
wherein the perovskite-type oxide is represented by the following general formula (2):

$$(Pb_{a1} \alpha_{a2})(Zr_{b1} Ti_{b2} \beta_{b3}) O_c \quad (2)$$

where
Pb and α are A site elements,
Zr, Ti, and R are B site elements, and
a1, a2, b1, b2, b3, and c each represent a compositional ratio and satisfy $0.5 \leq a1$, $0 \leq a2 < 0.5$, $0 < b1 < 1$, $0 < b2 < 1$, $0 \leq b3 \leq 1$, and $0.5 < a1/(b1+b2+b3) < 1.07$.
<2>
The piezoelectric element according to <1>, wherein the electronegativity X is 1.1 or less.
<3>
The piezoelectric element according to <1> or <2>, wherein M in general formula (1) includes, as a main component, at least one selected from the group consisting of Ba, La, Sr, Bi, Li, Na, Ca, Cd, Mg, and K.
<4>
The piezoelectric element according to <1> or <2>, wherein M in general formula (1) includes at least one of Ba, La, or Sr.
<5>
The piezoelectric element according to any one of <1> to <4>, wherein 0.2 d.
<6>
The piezoelectric element according to any one of <1> to <4>, wherein 0.3 d.
<7>
The piezoelectric element according to any one of <1> to <4>, wherein 0.45 d.
<8>
The piezoelectric element according to any one of <1> to <7>, wherein the growth control layer has a film thickness of from 0.63 nm to 170 nm.
<9>
The piezoelectric element according to any one of <1> to <7>, wherein the growth control layer has a film thickness of from 0.63 nm to 40 nm.

<10>
The piezoelectric element according to any one of <1> to <9>, wherein N in general formula (1) is selected from the group consisting of Ru, Ir, Sn, Ni, Co, Ta, and Nb.
According to the present disclosure, a piezoelectric element that has high drive reliability in a high-humidity environment and that includes a piezoelectric layer formed of a perovskite-type oxide containing Pb can be provided.

DESCRIPTION OF THE PREFERRED EMBODIMENTS

Figure 1:
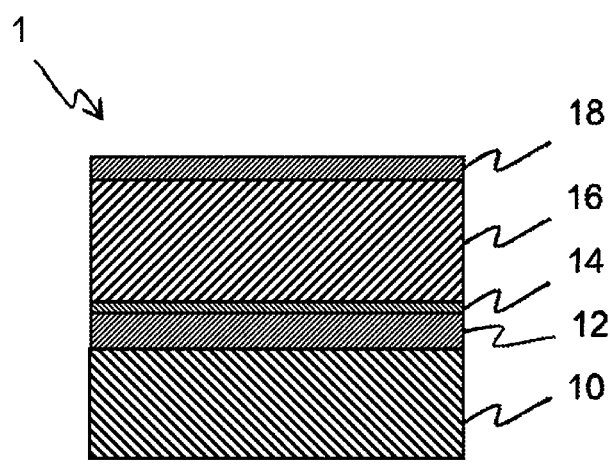
FIG. 1 is a sectional view illustrating a schematic configuration of a piezoelectric element according to one embodiment of the present disclosure.

An embodiment of the present disclosure will be described below with reference to the drawings. In the present specification, a numerical range represented using "to" refers to a range including values recited before and after "to" as lower and upper limits. For numerical ranges recited stepwise in the present disclosure, the upper or lower limit of a certain numerical range may be replaced by the upper or lower limit of another numerical range recited stepwise. For numerical ranges recited in the present disclosure, the upper or lower limit of a certain numerical range may be replaced by a value shown in the Examples.
FIG. 1 is a schematic sectional view of a piezoelectric element according to the present embodiment. As illustrated in FIG. 1, a piezoelectric element 1 is an element including, in sequence, a substrate 10, a lower electrode layer 12, a growth control layer 14, a piezoelectric layer 16, and an upper electrode layer 18. The piezoelectric element 1 is configured such that an electric field is applied to the piezoelectric layer 16 by the lower electrode layer 12 and the upper electrode layer 18 in the thickness direction.
The substrate 10 is not particularly limited, and examples thereof include substrates such as those formed of silicon, glass, stainless steel (SUS), yttrium-stabilized zirconia (YSZ), alumina, sapphire, and silicon carbide. As the substrate 10, a multilayer substrate such as an SOI substrate obtained by forming a $SiO_2$ oxide film on a surface of a silicon substrate may also be used.
The lower electrode layer 12 is an electrode for applying a voltage to the piezoelectric layer 16. The main component of the lower electrode layer 12 is not particularly limited, and examples thereof include metals such as gold (Au), platinum (Pt), iridium (Ir), ruthenium (Ru), titanium (Ti), molybdenum (Mo), tantalum (Ta), aluminum (Al), copper (Cu), and silver (Ag), metal oxides such as indium oxide (ITO: indium tin oxide), iridium oxide ($IrO_2$), ruthenium oxide (RuO$_2$), LaNiO$_3$, and SrRuO$_3$, and combinations thereof. It is particularly preferred to use Ir as the lower electrode layer 12.

The upper electrode layer 18 is an electrode, paired with the lower electrode layer 12, for applying a voltage to the piezoelectric layer 16. The main component of the upper electrode layer 18 is not particularly limited, and examples thereof include the materials given as examples for the lower electrode layer 12, electrode materials, such as chromium (Cr), that are commonly used in semiconductor processes, and combinations thereof.

In the present specification, "upper" and "lower" do not refer to "top" and "bottom"; of the pair of electrode layers disposed with the piezoelectric layer 16 therebetween, the electrode layer disposed on the substrate side is merely referred to as "lower electrode layer", and the electrode layer disposed on the opposite side from the substrate is merely referred to as "upper electrode layer".

The thicknesses of the lower electrode layer 12 and the upper electrode layer 18 are not particularly limited and are preferably about 50 nm to about 300 nm.

The piezoelectric layer 16 includes a perovskite-type oxide containing Pb as a main component of an A site (hereinafter referred to as "Pb-containing perovskite-type oxide"). The piezoelectric layer 16 is basically formed of a Pb-containing perovskite-type oxide. However, the piezoelectric layer 16 may include incidental impurities in addition to the Pb-containing perovskite-type oxide. In the present specification, an A site element of a perovskite-type oxide generally represented by the formula ABO$_3$ may be simply referred to as "A site", and a B site element thereof may be simply referred to as "B site". In the present specification, "main component" refers to a component that accounts for 50 mol % or more. That is, "containing Pb as a main component of an A site" means that Pb accounts for 50 mol % or more of the A site elements, irrespective of the other elements in the A site or the elements in the B site.

The Pb-containing perovskite-type oxide is represented by the following general formula (2):

$$(Pb_{a1}\alpha_{a2})(Zr_{b1}Ti_{b2}\beta_{b3})O_c \quad (2)$$

where Pb and α are A site elements, where α is at least one element other than Pb, and Zr, Ti, and β are B site elements, where β is at least one element other than Zr and Ti.

a1, a2, b1, b2, b3, and c each represent a compositional ratio (molar ratio), where 0.5≤a1, 0≤a2<0.5, 0<b1<1, 0<b2<1, and 0≤b3<1, and (a1+a2):(b1+b2+b3):c=1:1:3 is standard, although there may be a deviation from the standard value within the range where a perovskite structure can be formed. In addition, 0.5<a1/(b1+b2+b3)<1.07.

Examples of A site elements other than Pb in the Pb-containing perovskite-type oxide include lithium (Li), sodium (Na), potassium (K), magnesium (Mg), calcium (Ca), strontium (Sr), barium (Ba), lanthanum (La), cadmium (Cd), and bismuth (Bi). α is one of these elements or a combination of two or more of these elements.

Examples of B site elements other than Ti and Zr include scandium (Sc), vanadium (V), niobium (Nb), tantalum (Ta), chromium (Cr), molybdenum (Mo), tungsten (W), manganese (Mn), iron (Fe), ruthenium (Ru), cobalt (Co), iridium (Ir), nickel (Ni), copper (Cu), zinc (Zn), gallium (Ga), indium (In), tin (Sn), and antimony (Sb). β is one of these elements or a combination of two or more of these elements.

The film thickness of the piezoelectric layer 16 is not particularly limited and is typically 200 nm or more, for example, 0.2 µm to 5 µm. Preferably, the film thickness of the piezoelectric layer 16 is 1 µm or more.

The growth control layer 14 includes a metal oxide represented by general formula (1). The growth control layer 14 is basically formed of a metal oxide represented by general formula (1). However, the growth control layer 14 may include incidental impurities.

$$M_d N_{1-d} O_e \quad (1)$$

where M is composed of one or more metal elements capable of substituting for the A site of the Pb-containing perovskite-type oxide provided over the growth control layer 14, and has an electronegativity of less than 0.95. M preferably includes, as a main component, at least one selected from the group consisting of Li, Na, K, Mg, Ca, Sr, Ba, La, Cd, and Bi within the range where the electronegativity is 1.17 or less. In the present specification, "includes, as a main component, at least one" means that the main component may be composed of only one element or may be composed of a combination of two or more elements. M may include metal elements, capable of substituting for the A site, other than the metal elements mentioned above. If M is composed of two or more metal elements, the electronegativity of M is defined as the sum of the electronegativities of the individual metal elements multiplied by the respective proportions of those metal elements in M.

N includes, as a main component, at least one selected from the group consisting of Sc, Zr, V, Nb, Ta, Cr, Mo, W, Mn, Fe, Ru, Co, Ir, Sn, Ni, Cu, Zn, Ga, In, and Sb. N is composed of a metal species that can function as a B site element in the Pb-containing perovskite-type oxide. N may include B site elements other than the metal elements mentioned above.

O is oxygen.

d and e each represent a compositional ratio, where 0<d<1, and when the electronegativity of M is X, $$1.41X-1.05 \leq d \leq A1 \cdot \exp(-X/t1)+y0$$

where $A1=1.68\times10^{12}$, $t1=0.0306$, and $y0=0.59958$.

The compositional ratio e varies depending on the valences of M and N.

Whether or not a certain element is a metal element capable of substituting for the A site of the Pb-containing perovskite-type oxide, or an element capable of substituting for the B site, is determined by the relative ionic sizes, i.e., ionic radii, of the A, B, and O ions. According to Netsu Sokutei 26 (3) 64-75, in perovskite-type oxides, the A site is in 12-fold coordination, and the B site is in 6-fold coordination; therefore, the formation of a perovskite-type structure depends on the sizes of AO and BO$_2$ layers stacked alternately. As a quantitative measure thereof, the tolerance factor t is expressed by the following equation:

$$t=(rA+rO)/\{\sqrt{2}(rB+rO)\}$$

where rA, rB, and rO are the ionic radii of the A, B, and O ions, respectively, at their respective positions.

In general, a perovskite-type oxide appears around t=1.05 to 0.90, and the ideal perovskite-type structure is achieved at t=1. In the present specification, elements capable of substituting for the A site and elements capable of substituting for the B site are defined as elements that satisfy a tolerance factor of 1.05 to 0.90. The ionic radii used herein are those listed in the table of ionic radii created by Shannon. Shannon's ionic radii are shown in R. D. Schannon, Acta Crystallogr. A32, 751 (1976).

The inventors have found that the presence of a growth control layer 14 satisfying the above conditions allows the formation of a piezoelectric layer 16 formed of a perovskite-type oxide that is substantially free of a pyrochlore phase (see Test 1 described later). In the present specification, "free of a pyrochlore phase" means that no diffraction peak corresponding to a pyrochlore phase is observed in a normal X-ray diffraction (XRD) measurement.

By controlling the compositional ratio of M, which is a metal element capable of substituting for the A site in the growth control layer 14, within the above range using the electronegativity X of M as a parameter, a single-layer Pb-containing perovskite-type oxide layer can be deposited without the formation of a pyrochlore phase.

As discussed above, growth control layers in the related art are limited to those having a perovskite structure or an oxygen octahedral structure. However, by controlling the electronegativity within a suitable range, it is possible to use not only a growth control layer having an octahedral structure such as a perovskite oxygen structure, but also a growth control layer formed of an amorphous structure.

In the related art, PZT with good crystallinity is obtained by microscopically epitaxially growing PZT on a growth control layer serving as a seed crystal. In contrast, lattice matching does not necessarily have to be performed in the present disclosure. Because the growth control layer 14 includes an element capable of substituting for the A site of the Pb-containing perovskite oxide, a pseudo-Pb atmosphere can be created near the interface, where a shortage of Pb tends to occur. This will allow a perovskite structure to be stably formed from the initial stage of the formation of the piezoelectric layer 16. It is thought that some of the A sites of the perovskite structure at the interface of the piezoelectric layer 16 with the growth control layer 14 are constituted by M in the growth control layer 14; however, it has no influence on piezoelectricity since the Pb-containing perovskite is not doped in its entirety with M. In addition, because the formation of a perovskite structure at the interface is promoted under the action of M, the formation of a pyrochlore phase can be inhibited, and a piezoelectric layer can be formed without the formation of a pyrochlore phase.

In addition, in the related art, Pb is added in excess amount at least at the initial stage of the deposition of a Pb-containing perovskite-type oxide, which results in the presence of a large amount of Pb in the interfacial region and therefore decreases long-term reliability in a high-humidity environment. However, in the techniques of the present disclosure, the piezoelectric layer 16 is a Pb-containing perovskite-type oxide film satisfying $0.5 < a1/(b1+b2+b3) < 1.07$ in its entirety. Thus, high drive reliability can be achieved in a high-humidity environment. The presence of the above growth control layer 14 allows a piezoelectric layer 16 formed of a Pb-containing perovskite-type oxide film to be obtained without the addition of Pb in excess amount and with substantially no pyrochlore phase formed therein.

In the growth control layer 14, M preferably includes Ba as a main component, and particularly preferably, M is Ba. It is preferred that M include 50 mol % or more Ba since the acceptable range of d can be greatly broadened. In addition, if M includes Ba, the deposition temperature of the piezoelectric layer provided on the growth control layer can be greatly reduced compared to cases where there is no growth control layer or a growth control layer containing no Ba is provided.

In $M_d N_{1-d} O_e$, $0.2 \leq d$ is preferred, $0.3 \leq d$ is more preferred, and $0.45 \leq d$ is particularly preferred.

If d is 0.2 or more, the number of options for the element species that can be used as M can be increased. If d is 0.3 or more, or 0.45 or more, the number of options for the element species can be further increased.

The growth control layer 14 preferably has a film thickness of from 0.63 nm to 170 nm, more preferably from 0.63 nm to 40 nm, particularly preferably from 0.63 nm to 10 nm. If the growth control layer 14 has a film thickness of 0.63 nm or more, the growth control layer 14 is sufficiently effective in inhibiting a pyrochlore phase. If the growth control layer 14 has a film thickness of 40 nm or less, the growth control layer 14 is highly effective in obtaining a good perovskite structure.

In addition, Nis preferably Ru, Ir, Sn, Zr, Ta, Ni, Co, or Nb. If N is any of these metals, a target for use in sputter deposition can be easily fabricated with high density since different phases are unlikely to appear. In particular, Ru, Ir, and Sn can form a growth control layer 14 with high conductivity; therefore, the growth control layer 14 can also function as a portion of the lower electrode.

Test 1

The conditions for the above growth control layer were determined based on the results of evaluations performed on samples of growth control layers fabricated with different compositions. The methods for fabrication and evaluation of the samples used for determination of the conditions for the growth control layer will be described below.

Sample Fabrication Method

Deposition Substrate

As deposition substrates, 25 mm square Si substrates, having a 1 μm thick thermal oxide film formed thereon, on which a 10 nm thick Ti adhesion layer and a 150 nm thick Ir lower electrode layer were stacked in sequence were used.

Deposition of Growth Control Layer

A sputtering apparatus manufactured by Pascal Co., Ltd. and capable of independently controlling a plurality of targets was used. The substrates with a lower electrode were mounted in the sputtering apparatus. Argon (Ar) was allowed to flow such that the degree of vacuum was 0.8 Pa, and the sputtering apparatus was set such that the substrate temperature was 500° C. A co-sputtering technique using a plurality of targets was employed for deposition of growth control layers with different compositional ratios. By arranging a plurality of targets during co-sputtering such that the targets are located diagonally with respect to the substrate, rather than exactly under the substrate, the targets can be simultaneously sputtered in the same environment. By controlling the power supplied to each target during deposition, growth control layers with different compositions were deposited.

Before the deposition of growth control layers with different compositional ratios, a growth control layer composition evaluation was performed in advance to determine the conditions for obtaining a growth control layer with the desired compositional ratio. Specifically, substrates were separately prepared for the growth control layer composition evaluation, and the composition evaluation was performed by X-ray fluorescence (XRF) to determine the conditions for the composition. An Axios X-ray fluorescence spectrometer manufactured by PANalytical was used as the evaluation apparatus. In the condition determination process, the layer for the composition evaluation had a film thickness of 300 nm to achieve sufficient X-ray fluorescence intensity. A Dektak 6M stylus film thickness gauge manufactured by ULVAC, Inc. was used for film thickness measurement. In the condition determination, the composition was controlled by adjusting the power supplied to each target during sputter deposition. In addition, the deposition time was adjusted to achieve the desired film thickness. The thus-determined conditions were used to fabricate samples including growth control layers shown in Table 1 described later.

Deposition of Piezoelectric Layer

A radio-frequency (RF) sputtering apparatus (MPS series sputtering apparatus manufactured by ULVAC, Inc.) was used as the deposition apparatus. A $Pb_x(Zr_{0.52-d/2}Ti_{0.48-d/2}Nb_d)$ sintered target with a diameter of 120 mm was used. Here, a target in which the amount of Nb doping was d=0.12 and the amount of Pb was x=1.15 was used. The distance between the target and the substrate was 60 mm.

The substrates with a lower electrode and a growth control layer were mounted in the RF sputtering apparatus, and a Nb-doped PZT film (hereinafter simply referred to as "PZT film") represented by $Pb_{a1}(Zr_{b1}Ti_{b2}Nb_{b3})O_e$ was deposited as a piezoelectric layer in an $Ar/O_2$ mixed atmosphere (02 volume fraction=2.0%) at a degree of vacuum of 0.3 Pa. The film thickness was 1.0 μm. When a sample including no growth control layer was fabricated, a piezoelectric layer was deposited in the same manner as above except that a substrate with a lower electrode but no growth control layer was mounted in the sputtering apparatus.

The substrate temperature was 650° C., and a power of 500 W was supplied to the target.

That is, a PZT film was deposited on the growth control layer at a substrate temperature (deposition temperature) of 650° C.

Evaluation Methods

PZT Composition Evaluation

A composition evaluation was performed on the resulting PZT films by XRF to determine their compositions. The amount of Pb in the A site varies depending on the deposition temperature because of its instability. Accordingly, the amount of Pb was defined as Pb/(Zr+Ti+Nb). The amounts of B site elements are constant irrespective of the deposition temperature; therefore, their compositional ratios were calculated such that Zr+Ti+Nb=1.

The amounts of Pb and Nb in the PZT film after deposition depend on the target composition and the deposition temperature. Since both were constant for all samples here, the amounts of Pb and Nb in the PZT film after deposition were constant. The amount of Pb was 1.065, and the amount of Nb was 0.141.

The amount of Nb is Nb/(Zr+Ti+Nb). If the film is all formed as a perovskite structure, Nb/(Zr+Ti+Nb)=b3/(b1+b2+b3), and Pb/(Zr+Ti+Nb)=a1/(b1+b2+b3).

PZT Crystallinity Evaluation

A PZT crystallinity evaluation was performed by XRD using RINT-ULTIMA III manufactured by Rigaku Corporation. The intensity of a different phase, i.e., a pyrochlore phase, was calculated and evaluated from the resulting data. The region where a pyrochlore phase is detected is around 290 in XRD. The resulting diffraction intensity of the (222) plane of a pyrochlore phase around 29° in XRD was rated on the following scale:

A: 100 cps or less
B: more than 100 cps to 1,000 cps
C: more than 1,000 cps 100 cps is a level similar to that of noise, and the absence of a peak exceeding 100 cps around 290 indicates that a pyrochlore phase is not present at a detectable level in XRD. Within the range of rating B, a pyrochlore phase is sufficiently inhibited compared to the related art, and the decrease in piezoelectricity is within the acceptable range. In the tables, 100 cps or less is denoted as $1\times10^2$, and 10,000 cps or more is denoted as $1\times10^5$.

Table 1 shows the composition, electronegativity, and compositional ratio d of M, the composition of N for each sample. Table 1 also shows the intensity of a pyrochlore phase and the rating results for each sample.

TABLE 1

| | Growth control layer | | | | | | PZT film Evaluation | |
|---|---|---|---|---|---|---|---|---|
| | M | | | | | | | |
| Sample No. | Ba | Sr | La | Electro-negativity | d | N | Pyrochlore intensity | Rating |
| 1 | 1 | 0 | 0 | 0.89 | 0 | Ru | $1\times10^5$ | C |
| 2 | 1 | 0 | 0 | 0.89 | 0.1 | | $1\times10^4$ | C |
| 3 | 1 | 0 | 0 | 0.89 | 0.2 | | $5\times10^2$ | B |
| 4 | 1 | 0 | 0 | 0.89 | 0.3 | | $1\times10^2$ | A |
| 5 | 1 | 0 | 0 | 0.89 | 0.45 | | $1\times10^2$ | A |
| 6 | 1 | 0 | 0 | 0.89 | 0.5 | | $1\times10^2$ | A |
| 7 | 1 | 0 | 0 | 0.89 | 0.63 | | $1\times10^2$ | A |
| 8 | 1 | 0 | 0 | 0.89 | 0.72 | | $1\times10^2$ | A |
| 9 | 1 | 0 | 0 | 0.89 | 1 | | $1\times10^2$ | A |
| 10 | 1 | 0 | 0 | 0.89 | 0.15 | Ta | $1\times10^5$ | C |
| 11 | 1 | 0 | 0 | 0.89 | 0.45 | | $1\times10^2$ | A |
| 12 | 1 | 0 | 0 | 0.89 | 0.55 | | $1\times10^2$ | A |
| 13 | 0.22 | 0.17 | 0 | 0.92 | 0.39 | Ru | $1\times10^2$ | A |
| 14 | 0.06 | 0.28 | 0 | 0.94 | 0.35 | | $1\times10^2$ | A |
| 15 | 0.33 | 0.22 | 0 | 0.91 | 0.55 | | $1\times10^2$ | A |
| 16 | 0.75 | 0.08 | 0 | 0.9 | 0.83 | | $1\times10^2$ | A |
| 17 | 0.21 | 0.49 | 0 | 0.93 | 0.7 | | $1\times10^2$ | A |
| 18 | 0.11 | 0.41 | 0 | 0.94 | 0.52 | | $1\times10^2$ | A |
| 19 | 0.16 | 0.1 | 0 | 0.91 | 0.26 | | $1\times10^2$ | A |
| 20 | 0 | 1 | 0 | 0.95 | 0 | Ru | $1\times10^5$ | C |
| 21 | 0 | 1 | 0 | 0.95 | 0.1 | | $3\times10^4$ | C |
| 22 | 0 | 1 | 0 | 0.95 | 0.2 | | $5\times10^3$ | C |
| 23 | 0 | 1 | 0 | 0.95 | 0.3 | | $5\times10^2$ | B |
| 24 | 0 | 1 | 0 | 0.95 | 0.35 | | $1\times10^2$ | A |
| 25 | 0 | 1 | 0 | 0.95 | 0.46 | | $1\times10^2$ | A |
| 26 | 0 | 1 | 0 | 0.95 | 0.55 | | $1\times10^2$ | A |
| 27 | 0 | 1 | 0 | 0.95 | 0.7 | | $1\times10^4$ | C |
| 28 | 0 | 1 | 0 | 0.95 | 1 | | $1\times10^5$ | C |
| 29 | 0 | 0 | 1 | 1.1 | 0 | Ru | $1\times10^5$ | C |
| 30 | 0 | 0 | 1 | 1.1 | 0.2 | | $1\times10^5$ | C |
| 31 | 0 | 0 | 1 | 1.1 | 0.3 | | $4\times10^4$ | C |
| 32 | 0 | 0 | 1 | 1.1 | 0.5 | | $8\times10^2$ | B |
| 33 | 0 | 0 | 1 | 1.1 | 0.6 | | $1\times10^2$ | A |
| 34 | 0 | 0 | 1 | 1.1 | 0.65 | | $1\times10^5$ | C |
| 35 | 0 | 0 | 1 | 1.1 | 0.72 | | $1\times10^5$ | C |
| 36 | 0 | 0 | 1 | 1.1 | 1 | | $1\times10^5$ | C |

Sample Nos. 1 to 9 are samples in which, as a growth control layer, $Ba_dRu_{1-d}O_e$, where M=Ba and N=Ru, was used, with d being varied. M, i.e., Ba, has an electronegativity of 0.89.

Sample Nos. 10 to 12 are samples in which, as a growth control layer, $Ba_dTa_{1-d}O_e$, where M=Ba and N=Ta, was used, with d being varied. Ba has an electronegativity of 0.89.

Sample Nos. 13 to 19 are samples in which, as a growth control layer, $(Ba,Sr)_dRu_{1-d}O_e$, where M=Ba,Sr and N=Ru, was used, with the ratio of Ba to Sr being varied so that the electronegativity of M varied in the range of 0.90 to 0.94, and also with d being varied.

Sample Nos. 20 to 28 are samples in which, as a growth control layer, $Sr_dRu_{1-d}O_e$, where M=Sr and N=Ru, was used, with d being varied. Sr has an electronegativity of 0.95.

Sample Nos. 29 to 36 are samples in which, as a growth control layer, $La_dRu_{1-d}O_e$, where M=La and N=Ru, was used, with d being varied. La has an electronegativity of 1.1.

Figure 2:
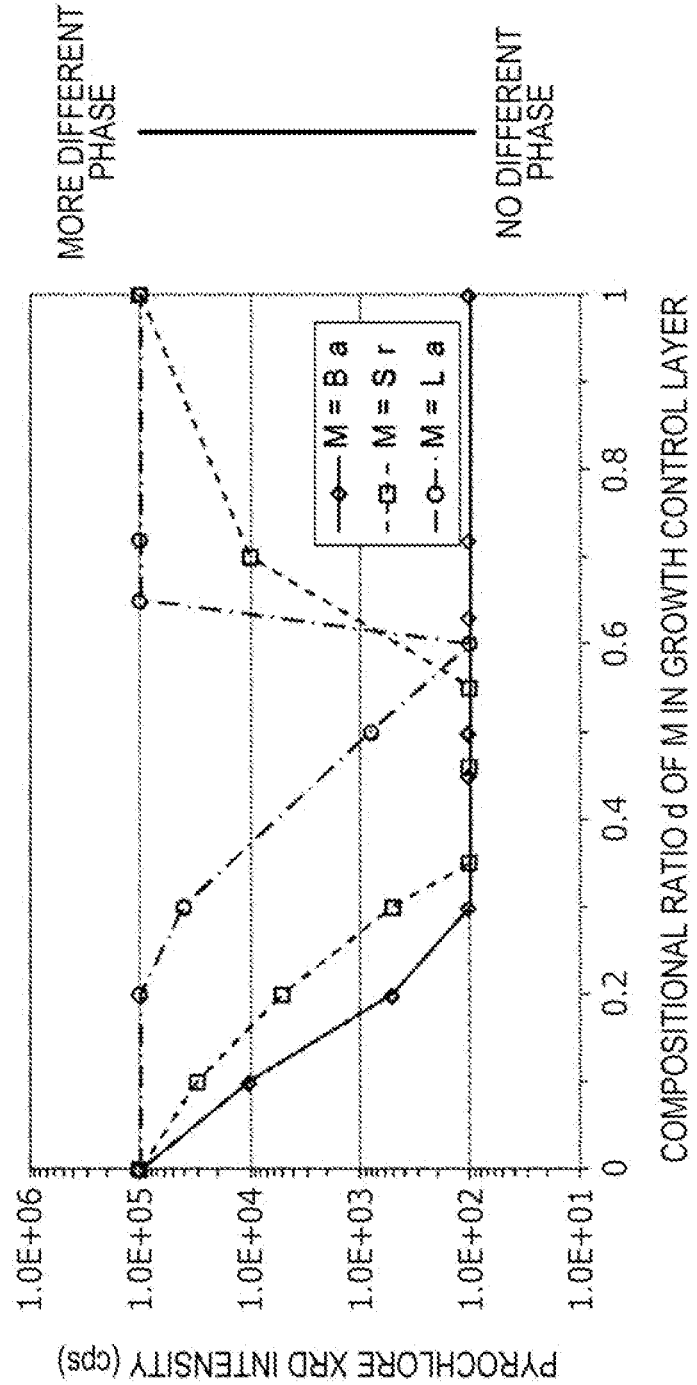
FIG. 2 is a graph showing the relationship between the compositional ratio d of a growth control layer and the X-ray diffraction intensity of a pyrochlore phase.

FIG. 2 shows the relationship between the compositional ratio d of M in the growth control layer and the XRD intensity of a pyrochlore phase for Samples Nos. 1 to 9, in which $Ba_dRu_{1-d}O_e$ was used as a growth control layer, Samples Nos. 20 to 28, in which $Sr_dRu_{1-d}O_e$ was used as a growth control layer, and Samples Nos. 29 to 36, in which $La_dRu_{1-d}O_e$ was used as a growth control layer. FIG. 2 is a semi-log graph having the vertical axis, which indicates the XRD intensity, on a logarithmic scale.

As shown in FIG. 2, when Ba was used, a PZT film in which a pyrochlore phase was sufficiently inhibited was obtained over a very wide composition range, i.e., 0.2≤d.

The range of compositional ratios d in which the XRD intensity of a pyrochlore phase satisfied $10^3$ or less was extracted from FIG. 2 for each of the cases where M was La, Sr, or Ba, as shown in Table 2.

TABLE 2

| M | Electronegativity (X) | Compositional lower limit ($M_{min}$) | Compositional upper limit ($M_{max}$) |
|---|---|---|---|
| La | 1.1 | 0.5 | 0.6 |
| Sr | 0.95 | 0.3 | 0.63 |
| Ba | 0.89 | 0.2 | 1 |

Figure 3:
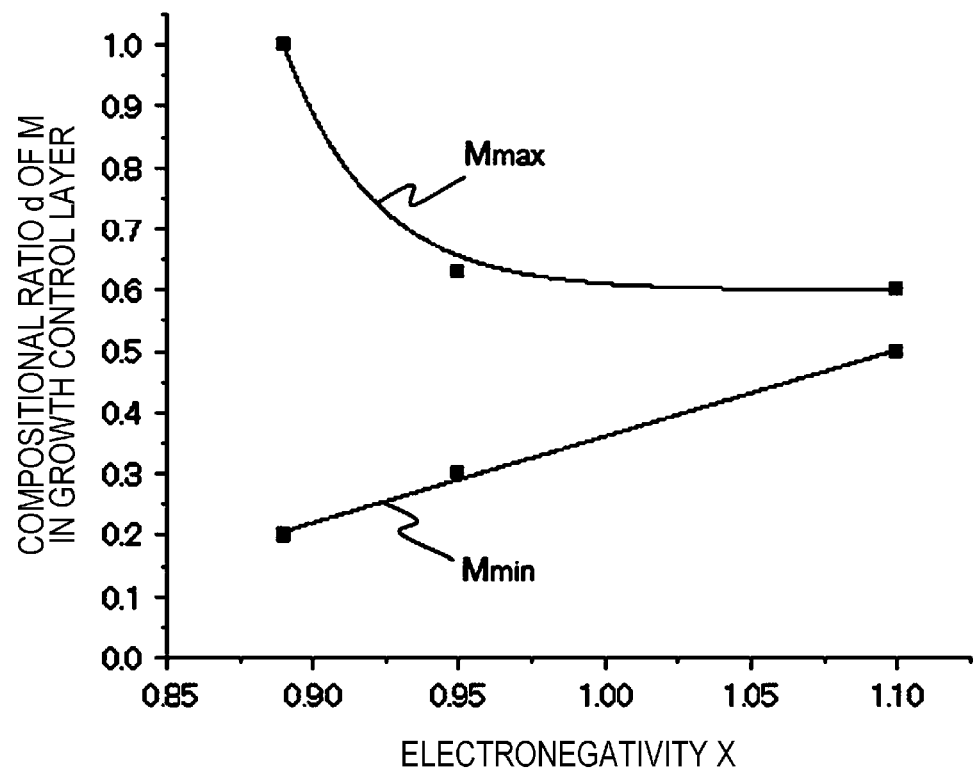
FIG. 3 is a graph showing the relationship between electronegativity and the compositional ratio d of a growth control layer.

FIG. 3 shows a graph plotting the compositional lower and upper limits, with the horizontal axis indicating the electronegativity of M and the vertical axis indicating the compositional ratio d shown in Table 2. In FIG. 3, fitting was performed using a straight line for the compositional lower limit and a curve for the compositional upper limit. The straight line indicating the compositional lower limit $M_{min}$ and the curve indicating the compositional upper limit $M_{max}$ were represented as a function of the electronegativity X by the following equations:

$$M_{min}=1.41X-1.05$$

$$M_{max}=A1 \cdot \exp(-X/t1)+y0$$

where $A1=1.68 \times 10^{12}$, $t1=0.0306$, and $y0=0.59958$.

It is presumed that a pyrochlore phase can be sufficiently inhibited in the region between the compositional lower limit and the compositional upper limit, that is, when the compositional ratio d of M is in the range of $M_{min} \leq d \leq M_{max}$.

$$1.41X-1.05 \leq d \leq A1 \cdot \exp(-X/t1)+y0$$

Figure 4:
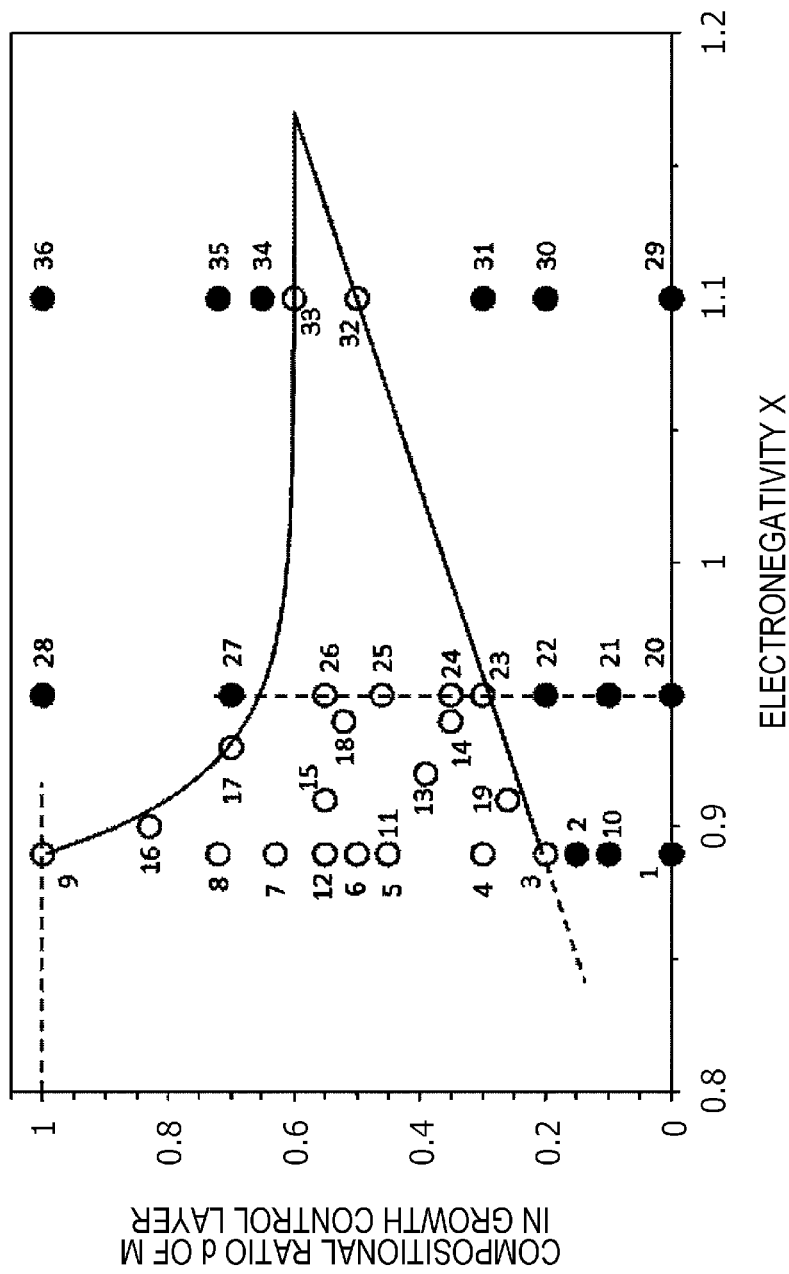
FIG. 4 is a graph showing the relationship between electronegativity and the compositional ratio d of a growth control layer.

FIG. 4 shows a graph plotting the compositional ratio d on the vertical axis against the electronegativity on the horizontal axis for each sample shown in Table 1. In FIG. 4, $M_{max}$ and $M_{min}$ are also shown. In FIG. 4, samples rated as A or B for pyrochlore phase are denoted by white circular markers (○) in Table 1, whereas samples rated as C are denoted by black circular markers (●). Numbers beside the markers represent Sample Nos. As shown in FIG. 4, all the samples in the region between the functions $M_{max}$ and $M_{min}$ were samples rated as A or B.

As discussed above, based on the above test results, the possible compositional ratio of the growth control layer according to the present disclosure were specified as $M_{max} \leq d \leq M_{min}$.

$M_{max}$ and $M_{min}$ intersect at X=1.17. That is, the possible maximum value of electronegativity is 1.17.

If Ba is used as M, a piezoelectric layer formed of a Pb-containing perovskite-type oxide that is free of a pyrochlore phase can be obtained when 0.2≤d. When 0.3≤d, the possible range of electronegativity can be broadened, and accordingly the range of options for M can be broadened. When 0.45≤d, the range of options for M can be further broadened.

If M includes K, which has a lower electronegativity than Ba, the electronegativity can be decreased, in which case d can take a value of less than 0.2.

Test 2

Furthermore, samples with varying amounts of Pb in PZT were fabricated and examined for the possible range of amounts of Pb.

As Sample Nos. 51 to 53, samples including PZT films formed using $Ba_{0.45}Ru_{0.55}O$ as a growth control layer, as with Sample No. 5, with a1/(b1+b2+b3) being varied in the range of 0.67 to 1.03, were fabricated.

As Sample Nos. 55 to 60, samples including PZT films formed using $Sr_{0.46}Ru_{0.54}O$ as a growth control layer, as with Sample No. 29, with a1/(b1+b2+b3) being varied in the range of 0.67 to 1.03, were fabricated.

As Sample No. 61, a sample including a PZT film formed using $La_{0.60}Ru_{0.40}O$ as a growth control layer, as with Sample No. 43, with a1/(b1+b2+b3) being 1.03, was fabricated.

As Sample No. 70, no growth control layer was provided, and a PZT film was directly formed on the lower electrode layer. Here, a sample including a PZT film formed with a1/(b1+b2+b3) being 1.065 was fabricated.

Each sample was fabricated by the same sample fabrication method as in Test 1 except that a target containing Pb in an amount that resulted in the desired amount of Pb in the deposition of the piezoelectric layer was used. The amount of Nb doping was the same as in Test 1 and was common to all samples.

Table 3 shows the results of the above PZT crystal evaluation for each sample.

TABLE 3

| Sample No. | Growth control layer | PZT film Pb/(Zr + Ti + Nb) | Evaluation Pyrochlore intensity | Rating |
|---|---|---|---|---|
| 5 | $Ba_{0.45}Ru_{0.55}O$ | 1.065 | $1 \times 10^2$ | A |
| 51 | | 0.67 | $5 \times 10^2$ | B |
| 52 | | 0.96 | $5 \times 10^2$ | B |
| 53 | | 1.03 | $5 \times 10^2$ | B |
| 29 | $Sr_{0.46}Ru_{0.54}O$ | 1.065 | $1 \times 10^2$ | A |
| 55 | | 0.67 | $5 \times 10^2$ | B |
| 56 | | 0.77 | $5 \times 10^2$ | B |
| 57 | | 0.88 | $5 \times 10^2$ | B |
| 58 | | 0.95 | $5 \times 10^2$ | B |
| 59 | | 0.96 | $5 \times 10^2$ | B |
| 60 | | 1.03 | $5 \times 10^2$ | B |
| 43 | $La_{0.60}Ru_{0.40}O$ | 1.065 | $1 \times 10^2$ | A |
| 61 | | 1.03 | $5 \times 10^2$ | B |
| 70 | None | 1.065 | $1 \times 10^2$ | C |

All the samples including a growth control layer were rated as A or B. Thus, a pyrochlore phase was inhibited, and a PZT film with good crystallinity was obtained.

In Table 4, the evaluations for crystallinity of the perovskite structures formed with or without the various growth control layers were sorted based on Table 3 above for each amount of Pb.

TABLE 4

| Amount of Pb Pb/(Zr + Ti + Nb) | Growth control layer | | | Without growth control layer |
|---|---|---|---|---|
| | $Ba_{0.45}Ru_{0.55}O$ | $Sr_{0.46}Ru_{0.54}O$ | $La_{0.60}Ru_{0.40}O$ | |
| 0.67 | B | B | n/a | n/a |
| 0.77 | n/a | B | n/a | n/a |
| 0.88 | n/a | B | n/a | n/a |
| 0.95 | n/a | B | n/a | n/a |
| 0.96 | B | B | n/a | n/a |
| 1.03 | B | B | B | n/a |
| 1.065 | A | A | A | C |

In the table, "n/a" means that no sample was fabricated. In the case of BaRuO growth control layers, a pyrochlore phase was inhibited for amounts of Pb of both 0.67 and 0.96. This suggests that a pyrochlore phase can be similarly inhibited for amounts of Pb of between 0.67 and 0.96. In the case of LaRuO, on the other hand, it is currently uncertain whether or not a pyrochlore phase can be inhibited for amounts of Pb of 0.96 or less. Nevertheless, at least in the case of BaRuO and SrRuO growth control layers, it is evident that a PZT film can be obtained for amounts of Pb of 0.67 to 1.065. When no growth control layer was provided, the resulting film was almost composed of a pyrochlore phase for an amount of Pb of 1.065. This suggests that similar results will be obtained for any smaller amount of Pb.

As discussed above, the techniques of the present disclosure can inhibit a pyrochlore phase and provide a piezoelectric element including a PZT film in which the amount of Pb is less than 1.07. Because the amount of Pb in the PZT film can be controlled below 1.07 throughout the film, high drive reliability can be achieved in a high-humidity environment.

Test 3

Samples including $Ba_{0.45}Ru_{0.55}O$ growth control layers with varying film thicknesses were fabricated and examined for the dependence of the crystallinity of the PZT film on the film thickness of the growth control layer. The fabrication method was the same as the above sample fabrication method, and only the film thickness of the growth control layer was varied in the range of 0.5 nm to 170 nm.

Figure 5:
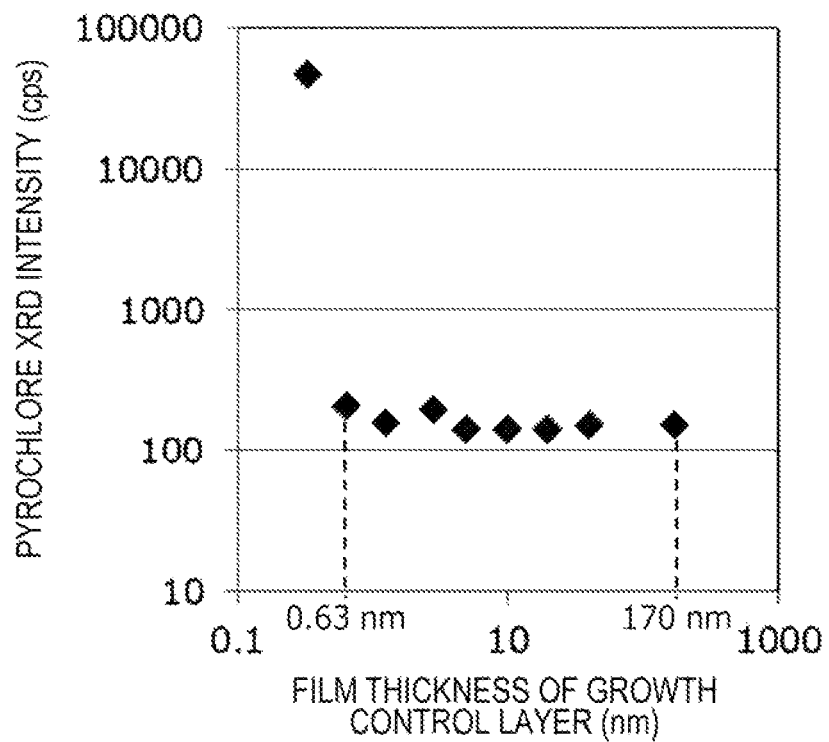
FIG. 5 is a graph showing the relationship between the film thickness of a growth control layer and the XRD intensity of a pyrochlore phase.

The XRD intensity of a pyrochlore phase in the piezoelectric layer of each sample was measured as in the above PZT crystallinity evaluation. The results are shown in FIG. 5. FIG. 5 is a log-log graph showing the relationship between the film thickness of the growth control layer and the diffraction intensity of a pyrochlore phase.

As shown in FIG. 5, it was found that a growth control layer having a film thickness of 0.63 nm or more is sufficiently effective in inhibiting a pyrochlore phase.

Figure 6:
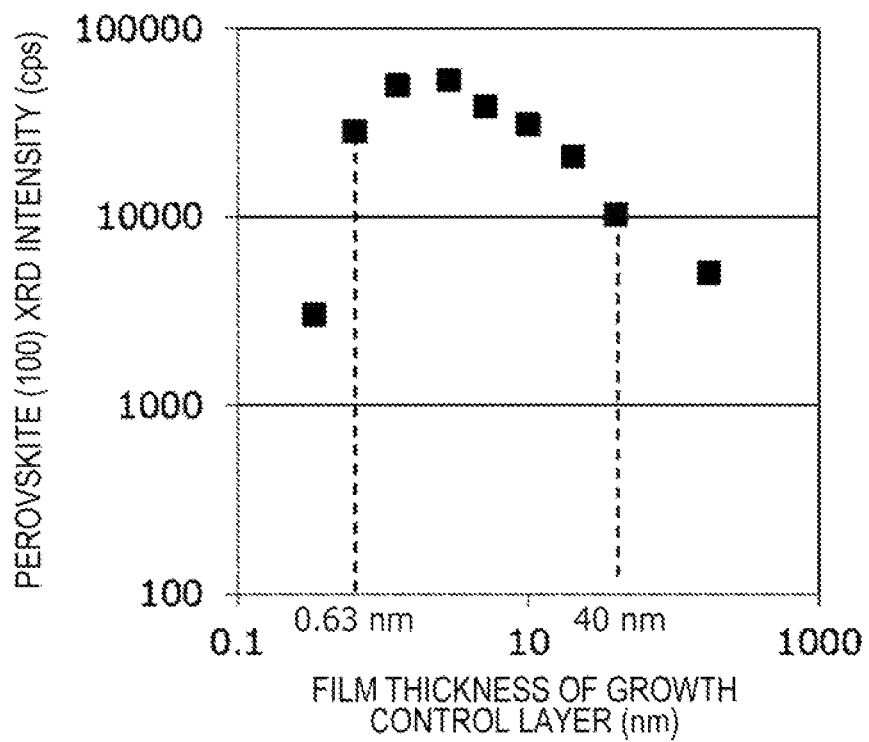
FIG. 6 is a graph showing the relationship between the film thickness of a growth control layer and the XRD intensity of (100) of a perovskite structure.

In addition, an XRD measurement was performed on the piezoelectric layer of each sample as in the PZT crystallinity evaluation. Here, the XRD intensity corresponding to (100) of a perovskite structure was calculated from the obtained data. A higher peak intensity corresponding to (100) of a perovskite structure indicates that the resulting perovskite-type oxide had better crystallinity. The results are shown in FIG. 6. FIG. 6 is a log-log graph showing the relationship between the film thickness of the growth control layer and the XRD intensity corresponding to (100) of a perovskite structure.

As shown in FIG. 6, it was found that the diffraction intensity peaks at a film thickness of about 5 nm, and a piezoelectric layer with the best crystallinity can be obtained. The diffraction intensity decreases as the film thickness increases above 5 nm. A film thickness of 40 nm or less is preferred to obtain a perovskite-type oxide with better crystallinity, i.e., an XRD intensity of $1 \times 10^4$ cps or more.

It is evident from the above results that the growth control layer preferably has a film thickness of from 0.63 nm to 170 nm, more preferably from 0.63 nm to 40 nm.

REFERENCE SIGNS LIST 1 piezoelectric element
10 substrate
12 lower electrode layer
14 growth control layer
16 piezoelectric layer
18 upper electrode layer

What is claimed is:

1. A piezoelectric element comprising, in sequence:
a substrate;
a lower electrode layer;
a growth control layer;
a piezoelectric layer including a perovskite-type oxide containing lead as a main component of an A site; and
an upper electrode layer, wherein the growth control layer includes a metal oxide represented by the following general formula (1):

$$M_d N_{1-d} O_e \qquad (1)$$

where
M is Ba or Sr,
N is Ru,
O is oxygen, and
d and e each represent a compositional ratio, where $0<d<1$, and when an electronegativity of M is X,
in a case in which M=Ba, d=0.45,
in a case in which M=Sr, d=0.46, $$1.41X - 1.05 \leq d \leq A1 \cdot \exp(-X/t1) + y0$$

where $A1=1.68 \times 10^{12}$, $t1=0.0306$, and $y0=0.59958$, and
wherein the perovskite-type oxide is represented by the following general formula (2):

$$Pb_{a1}\alpha_{a2}(Zr_{b1}Ti_{b2}\beta_{b3})O_c \qquad (2)$$

where
Pb is an A site element,
Zr, Ti, and β are B site elements, and
a1, b1, b2, b3, and c each represent a compositional ratio and satisfy $0.67 \leq a1 \leq 0.96$, $0<b1<1$, $0<b2<1$, and
wherein the growth control layer has a film thickness of from 0.63 nm to 40 nm.

* * * * *